(12) United States Patent
Vemula et al.

(10) Patent No.: US 9,537,462 B2
(45) Date of Patent: Jan. 3, 2017

(54) COMMUNICATION CIRCUIT WITH IMPEDANCE MATCHING

(71) Applicant: NXP B.V., Eindhoven (NL)

(72) Inventors: Madan Vemula, Tempe, AZ (US); James Spehar, Chandler, AZ (US)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 14/286,057

(22) Filed: May 23, 2014

(65) Prior Publication Data
US 2015/0341013 A1     Nov. 26, 2015

(51) Int. Cl.
| H03H 7/40 | (2006.01) |
| H01L 23/66 | (2006.01) |
| H03H 11/30 | (2006.01) |
| H01L 23/00 | (2006.01) |

(52) U.S. Cl.
CPC ............... *H03H 7/40* (2013.01); *H01L 23/66* (2013.01); *H03H 11/30* (2013.01); *H01L 24/13* (2013.01); *H01L 24/16* (2013.01); *H01L 2223/6655* (2013.01); *H01L 2224/131* (2013.01); *H01L 2224/16225* (2013.01); *H01L 2924/10253* (2013.01); *H01L 2924/14* (2013.01); *H01L 2924/30111* (2013.01)

(58) Field of Classification Search
CPC ............ H03H 7/40; H03H 11/30; H01L 23/66
USPC ......................................................... 333/17.3
See application file for complete search history.

(56) References Cited

U.S. PATENT DOCUMENTS

| 7,463,112 | B1 | 12/2008 | Groves |
| 7,633,355 | B2* | 12/2009 | Matsuo ........................ 333/32 |
| 8,303,315 | B2 | 11/2012 | Lee |
| 8,451,044 | B2* | 5/2013 | Nisbet ................ H03K 17/687 327/308 |
| 8,554,136 | B2* | 10/2013 | McCormack ........... H04B 5/02 340/539.1 |
| 8,638,838 | B1 | 1/2014 | Betts et al. |
| 2004/0251983 | A1 | 12/2004 | Hsu et al. |
| 2008/0211598 | A1* | 9/2008 | Eplett .......................... 333/17.3 |
| 2010/0065846 | A1* | 3/2010 | Satoh .............................. 257/48 |
| 2013/0012067 | A1 | 1/2013 | Lee |
| 2013/0063223 | A1 | 3/2013 | See et al. |
| 2013/0069737 | A1* | 3/2013 | See .......................... H04B 1/18 333/32 |

(Continued)

OTHER PUBLICATIONS

Intel Technology Brief, "Thunderbolt Technology, The Fastest Connection to your PC" 2012.

(Continued)

*Primary Examiner* — Stephen E Jones
*Assistant Examiner* — Scott S Outten

(57) ABSTRACT

Aspects of the present disclosure are directed to addressing impedance-matching issues. As may be implemented in connection with one or more embodiments, an apparatus includes an integrated circuit (IC) chip having a signal-connection terminal and processing circuitry that passes signals along a communication path that is within the IC chip and connected to the signal-connection terminal. Impedance-matching circuitry operates to provide impedance-matching for the communication path, therein mitigating signal loss due to impedance-mismatching. A chip-mounting structure secures the IC chip and electrically connects thereto at the signal-connection terminal.

21 Claims, 13 Drawing Sheets

(56) References Cited

U.S. PATENT DOCUMENTS

2013/0207739 A1* 8/2013 Bakalski ................. H03H 7/40
                                                   333/33
2014/0073267 A1* 3/2014 Cabanillas ........... H04B 1/0458
                                                   455/79

OTHER PUBLICATIONS

European Search Report for Application No. 15166517.1 (Oct. 2015).

* cited by examiner

COMMUNICATION CIRCUIT WITH IMPEDANCE MATCHING

Aspects of various embodiments are directed to communications, such as communications between electronic devices, and related impedance matching.

Many electronic devices communicate with each other over one or more communication channels. Ensuring the integrity of these communications can be important, and also challenging to implement. For instance, the mobile, PC, smart TV and tablet industries often desire smaller integrated circuits (IC's) with wafer level chip scale packaging, which can reduce the total height of the chip after mounting the IC on printed circuit boards in both host and device systems. Further, these systems desirably operate to allow the host and device to communicate using various interface standards, which operate using different speeds (e.g., 10 Gbps, 5.4 Gbps, 5 Gbps, and 8 Gbps). Further, signal integrity requirements can become more important at higher data rates (e.g., 10 Gbps).

Many applications are susceptible to signal loss pertaining to return and/or insertion loss, as may result when signals are reflected or lost. In certain instances, such losses can be on the order of −7 dB or higher, or as may relate to loss of nearly half of the energy of a transmitted signal. Further, issues may arise when reflected signals are not recoverable.

These and other matters have presented challenges to communications between devices, using a variety of standards and speeds, and for a variety of applications.

Various example embodiments are directed to communication circuits with impedance matching, and their implementation.

According to an example embodiment, an apparatus includes an integrated circuit (IC) chip and a chip-mounting structure that secures the IC chip and is electrically connected to the chip at a signal-connection terminal of the IC chip. The IC chip also includes processing circuitry and impedance-matching circuitry. The processing circuitry passes signals along a communication path that lies within the IC chip and is connected to the signal-connection terminal. The impedance-matching circuitry mitigates signal loss due to impedance-mismatching, by providing impedance-matching for the communication path. Other embodiments are directed to methods of impedance matching, in accordance with this apparatus-based approach.

Another embodiment is directed to an apparatus including a chip-mounting structure having a planar surface and a signal connection terminal, an IC chip, and impedance-matching circuitry. The IC chip has a signal connection terminal on a planar surface that faces the planar surface of the chip-mounting structure, with the respective signal connection terminals being connected to one another. The IC chip includes an interface circuit that interfaces with a remote device via a communication link (e.g., a USB cable), and processing circuitry that passes signals received from the interface circuit along a communication path, which includes interconnect circuitry within the IC chip and which is connected to the signal-connection terminals. The impedance-matching circuitry addresses signal loss issues by matching an impedance presented at the interface circuit, such as an impedance provided by a connected cable. Other embodiments are directed to related methods.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
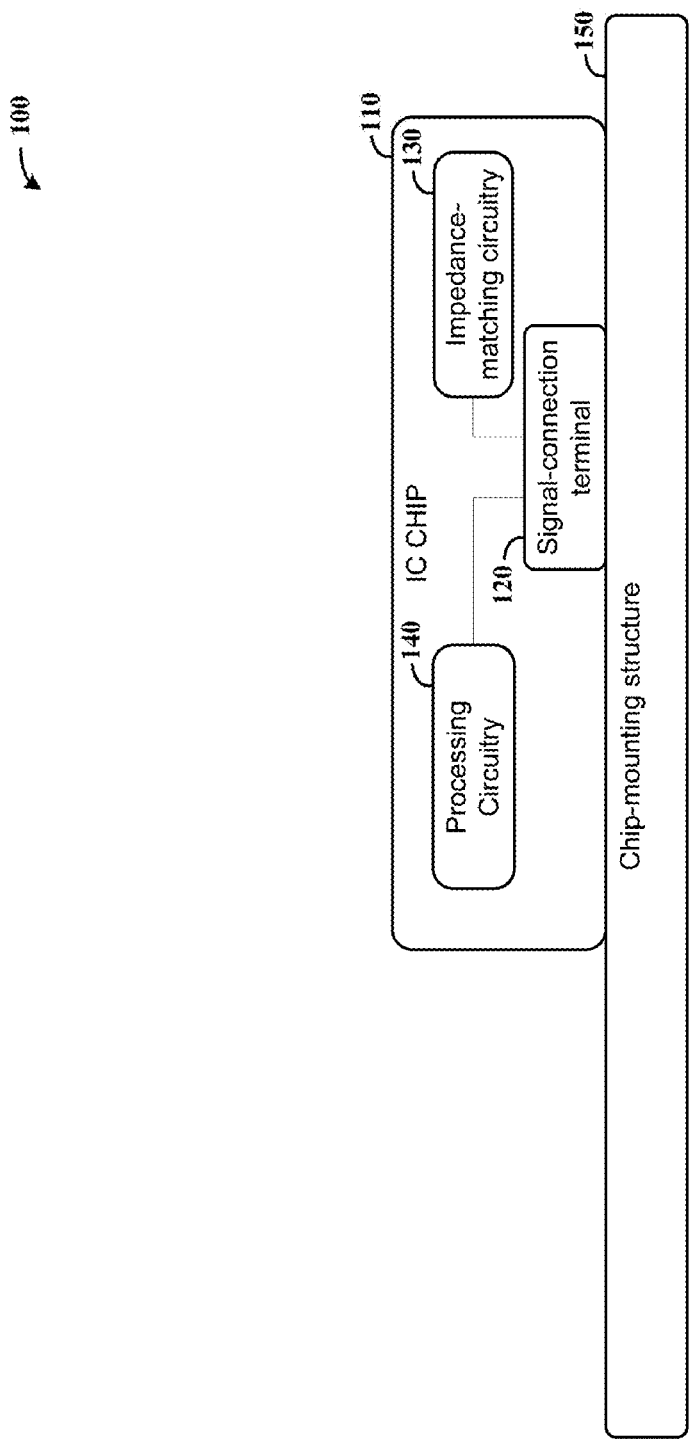
FIG. 1 shows a circuit with impedance-matching aspects, in accordance with another example embodiment.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving impedance matching. While not necessarily so limited, various aspects may be appreciated through a discussion of examples using this context.

Various example embodiments are directed to improving signal integrity by lowering/mitigating or eliminating signal loss, such as return loss, by matching impedances between respective circuit components. This approach can be implemented to effectively widen bandwidth and reduce insertion loss. In some implementations, the impedance matching involves using inductors, such as silicon inductors, and can be implemented on chip scale packaging products. In certain embodiments, such impedance matching is carried out using on-chip or on-silicon inductors that operate to provide an increased impedance at a communication port at higher frequencies, matching an impedance (e.g., by utilizing on chip silicon inductors and on chip capacitance) presented to the communication port (e.g., via a communication cable connecting respective devices). Such an approach may, for example, facilitate the use of packaging that contains an insufficient amount of (or omits) one or more circuit connectors, such as bond wires, that would otherwise provide impedance.

Various aspects of the present disclosure may be implemented with a variety of different types of communication links and related protocols/standards. For instance, high speed multiplexers used for communications between handheld devices and personal computers, or between computers or media devices and peripherals, may be implemented in this regard to improve return and/or insertion loss. Moreover, standards like Lightning and Thunderbolt, AUX, DDC, I2C, and SPI with USB, DisplayPort, PCI express, DDR3 and USB type C can be implemented using approaches described herein.

In a particular embodiment involving a device (e.g., source or sink device) having an input terminal and an output terminal, two silicon inductor circuits are added within silicon substrate housing interconnects, with one inductor circuit connected to each of the input and output terminals. In some embodiments, the inductor circuits are fixed and operate to provide a set impedance, such as may be implemented for an intended implementation while the device is in service (e.g., 50 Ohms). In this context, the return loss may be characterized as:

$$\Gamma = \frac{Z_L - Z_S}{Z_L + Z_S},$$

where $Z_S$ is the impedance looking toward the signal source and $Z_L$ is the impedance looking toward the load.

Another example embodiment is directed to an IC having a signal-connection terminal, processing circuitry and impedance-matching circuitry (e.g., as may be embedded within a silicon layer of the IC). The processing circuitry passes signals along a communication path within the IC and connected to the signal-connection terminal. The impedance-matching circuitry mitigates signal loss due to impedance mismatching, by matching an impedance presented to the signal-connection terminal. For instance, such an approach can be used to improve signal integrity/mitigate signal loss by matching an impedance presented at an interface between the IC and an external connector, such as a USB cable connected to an external load. The impedance may be further implemented based on a signal speed of signals passed along the communication path. Further, such an approach can be implemented where the signal-connection terminal is connected to a chip-mounting structure that secures the IC chip and that is electrically connected to the IC chip at the signal-connection terminal (e.g., and connecting the chip to an interface/external cable).

The impedance-matching circuitry is implemented using one or more of a variety of components to suit particular applications. In some embodiments, the impedance-matching circuitry includes one or more inductors that provide impedance matching for the communication path via connection to the signal-connection terminal. Such a terminal may, in turn, be connected to other circuitry on a package including the chip-mounting structure. In other embodiments, the impedance-matching circuitry includes an inductor that operates with a capacitance in the IC chip to provide an LC circuit having an impedance that matches an impedance presented via the signal-connection terminal (e.g., by creating resonance with the capacitance). In various embodiments, impedance-matching circuitry implemented in a common substrate with other circuits, such as interconnects, is separated from the other circuits so as to mitigate or minimize inductive coupling to the other circuits within the substrate.

In some embodiments, the impedance-matching circuitry operates to variably match an impedance presented at an interface. In one such embodiment, the impedance-matching circuitry includes a variable inductor circuit. An external impedance is detected, as provided by an external load and interconnections between the external load and a signal-connection terminal. The variable inductor is dynamically modified, based upon the detected impedance. In some embodiments, such a variable impedance is achieved using a variable-length inductor circuit by selectively connecting and/or disconnecting portions of the inductor circuit to set the length thereof, for example. For instance, one or more switches can be connected to such a variable-length inductor and used to modify the inductance provided by the inductive circuit, by connecting and disconnecting portions of the variable-length inductor.

One or more impedance-matching approaches as discussed herein may, for example, be implemented to enhance a 3 dB frequency and also make return loss very high, such that much of the propagated signal is transmitted and not reflected due to the impedance mismatch. An inductor working together with capacitance on the IC chip can form an LC circuit that has set impedance (e.g., 50 Ohm) at a certain frequency. With such an approach, an impedance (as characterized looking into the IC) can match impedance of a cable transmitting a signal being communicated.

An IC chip, as discussed above, may be connected in one or more of a variety of manners, to suit particular applications. In some embodiments, the IC chip has a lower planar surface, with the signal-connection terminal being at or on the lower planar surface, and is connected to a chip-mounting at an upper planar surface thereof, via the terminal. The respective surfaces are in contact (e.g., close to contact via connection terminals/solder bumps therebetween) with impedance matching circuitry connected to one or more of the connection terminals.

Another embodiment is directed to an apparatus including a chip-mounting structure having a planar surface and a signal connection terminal connected to another signal connection terminal on a facing planar surface of an IC chip. The IC chip includes an interface circuit that interfaces with a remote device via a communication link, such as a cable, and includes processing circuitry that passes signals received via the interface circuit along a communication path, including interconnect circuitry within the IC chip and connected to the signal-connection terminals. Such processing circuitry may include, for example, a multiplexer or other switching circuits. The apparatus further includes impedance-matching circuitry that provides impedance matching for the communication path, reducing impedance mismatching between the IC chip and the communication link and therein mitigating signal loss. In some implementations, the impedance-matching circuitry includes an inductor that operates with a capacitance of the IC chip to provide an LC circuit that matches the impedance. The impedance-matching circuitry may be spaced apart from interconnect circuitry in a common silicon layer, using the silicon spacing to mitigate inductive coupling.

Various other embodiments are directed to methods as may be implemented in accordance with one or more aspects above. In one embodiment, a method involves passing signals along a communication path within an IC chip having a signal-connection terminal and processing circuitry such as above. Signal loss due to impedance mismatching is countered by providing impedance matching for the communication path. The signal-connection terminal may, for example, be electrically connected to a chip-mounting structure that secures the IC chip, the signals being passed via the signal-connection terminal. In some implementations, mitigating signal loss due to impedance-mismatching includes using an inductor and a capacitance provided by the IC chip to match an impedance presented at an interface between the IC chip and an external communication link (e.g., by creating resonance). Further, variable impedance matching is carried out by detecting an impedance for matching, setting an inductance based upon the detected external impedance and a capacitance of the IC chip, and using the variable inductor circuit at the set inductance to match the detected external impedance Turning now to the figures, FIG. 1 shows a circuit 100 with impedance-matching aspects, in accordance with another example embodiment. The circuit 100 includes an IC chip 110 having a signal connection terminal 120 and impedance-matching circuitry 130 that provides an impedance that matches an impedance at the signal connection terminal 120. Processing circuitry 140 is connected to the signal connection terminal, which is further shown optionally coupled to a chip mounting structure 150. The impedance-matching circuitry 130 may, for example, be implemented as discussed above, using one or more of a variety of approaches. As such, the various embodiments described herein may be combined in certain embodiments, and various aspects of individual embodiments may be implemented as separate embodiments. For instance, aspects of FIG. 1 involving some of or the entire IC chip 110 can be implemented separately, or individual combinations therewith may be made.

Figure 2:
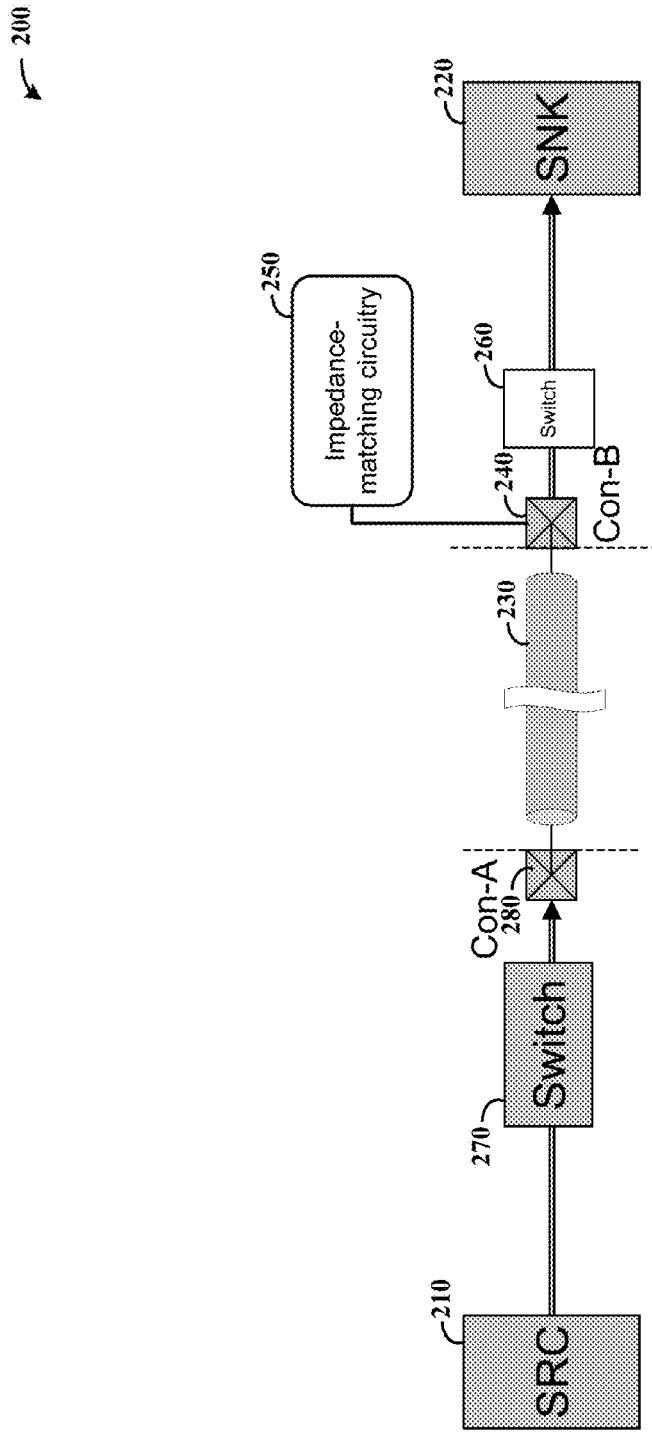
FIG. 2 shows another circuit including impedance-matching circuitry, in accordance with another example embodiment.

FIG. 2 shows a circuit 200 including impedance-matching circuitry 250, in accordance with another example embodiment. A source SRC 210 (Transmitter) and a sink SNK 220 (Receiver) communicate with one another via a communication link 230, connected to interfaces 240 and 280, at which a compliant impedance is desired for safe communications. Other circuitry, such as switch 270 and switch 260 (e.g., interconnects or other functional circuits), may be present as shown. The impedance-matching circuitry 250 operates to mitigate impedance mismatches, such as those pertaining to one or more of insertion loss, return loss, noise, crosstalk, interference, termination accuracy, launched signal quality, amplitude sensitivity, and jitter tolerance.

Figure 3:
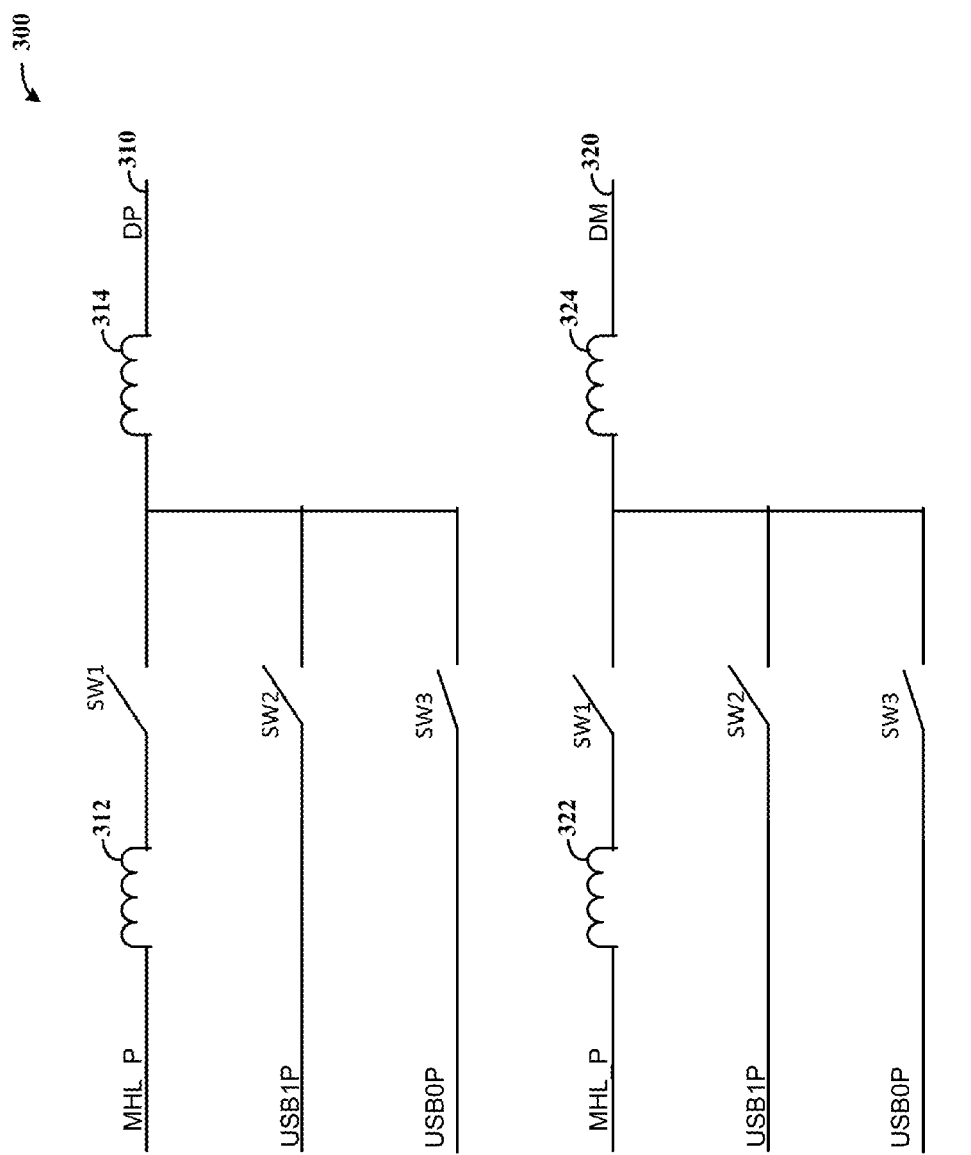
FIG. 3 shows a circuit for device connectivity including signal reception and transmission pins, in accordance with another example embodiment.

FIG. 3 shows a circuit 300 for USB (universal serial bus) connectivity including DP and DM (receiver/transmitter) pins 310 and 320, in accordance with another example embodiment. Respective switches connect USB ports for USB0P and USB1P (e.g., USB signaling channels) connectivity for each pin, as well as for a mobile high definition link (MHL_P) via inductors 312 and 322. Inductors 314 and 324 operate to mitigate impedance mismatch. Such an approach can be used, for example, to enhance bandwidth and return loss for MHL 3.0 (Mobile high definition Link @6 gbps) channel. The inductors as shown mitigate capacitive loading added by the USB channels, which add capacitive loading at the pins (DP/DM) 310 and 320, and thus mitigate reductions in Bandwidth for the MHL channel.

Figure 4:
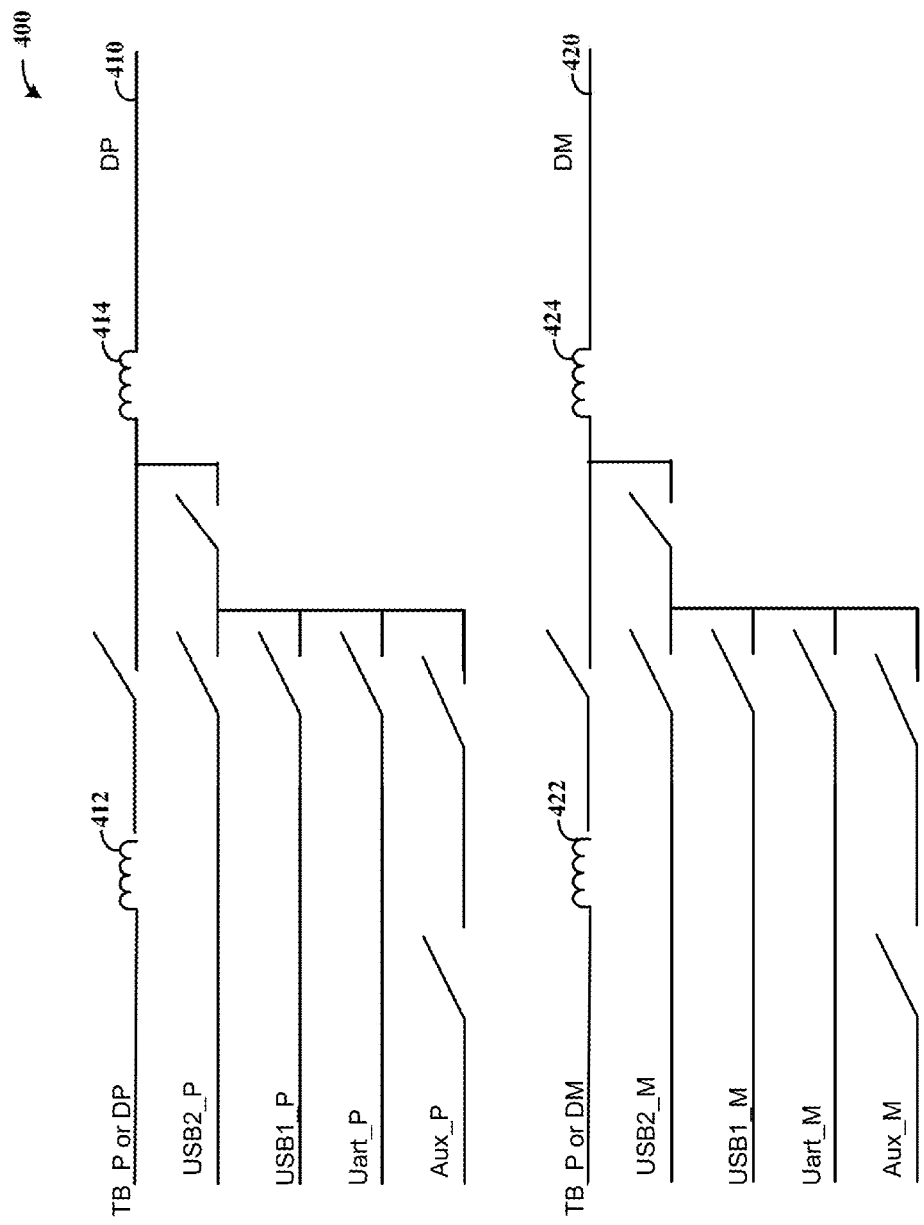
FIG. 4 shows another impedance matching circuit, in accordance with another example embodiment.

FIG. 4 shows another circuit 400, in accordance with another example embodiment. The circuit 400 may be implemented in a manner similar to that shown in FIG. 3, with additional ports adding capacitive loading. Respective receiver and transmitter ports 410 and 420 are shown, for which one or more inductors 412, 414, 422 and 424 operate to impedance match. Capacitive loading from USB2, USB1, UART and Aux channel inputs that can degrade return loss and bandwidth are compensated via one or more of the inductors.

Figure 5:
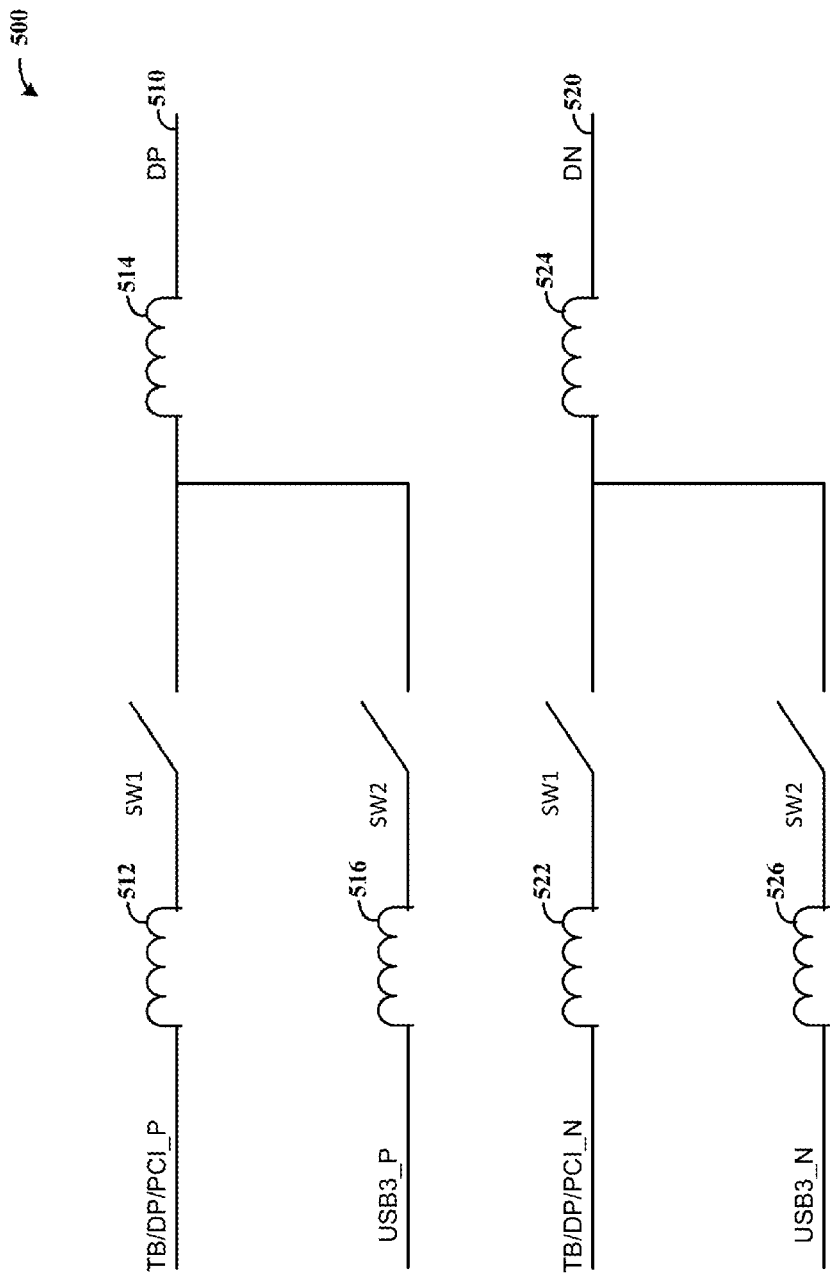
FIG. 5 shows another circuit having impedance matching, in accordance with another example embodiment.

FIG. 5 shows another circuit 500 having impedance-matching circuitry for respective receiver and transmitter ports 510 and 520, in accordance with another example embodiment. One or more of inductors 512, 514 and 516 operate to match impedance for receiver port 510, and one or more of inductors 522, 524 and 526 operate to match impedance for transmitter port 520. Such an approach may be implemented with two high speed channels, such as with USB3 and TB/DP/PCI (Thunderbolt, DisplayPort, PCI express) paths as shown.

Figure 6:
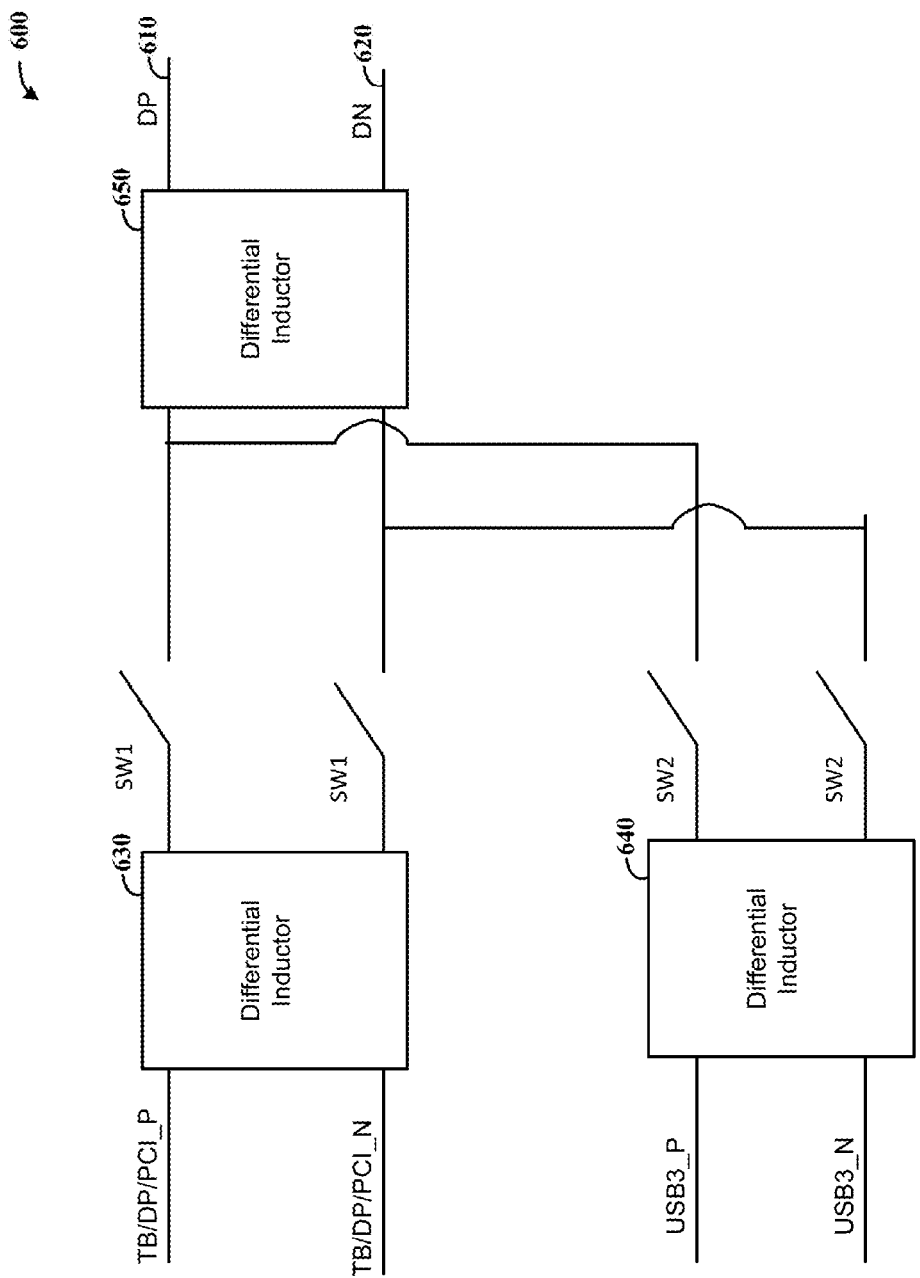
FIG. 6 shows a circuit with impedance matching and a differential inductor, in accordance with another example embodiment.

FIG. 6 shows a circuit 600 with impedance matching circuitry and differential inductor circuitry coupled to receive and transmit ports 610 and 620, in accordance with another example embodiment. Differential inductors 630 and 640 are respectively coupled for TB/DP/PCI pairs and for USB3 pairs, and are selectively coupled to differential inductor 650 which is coupled to the receive and transmit ports 610 and 620.

Figure 7:
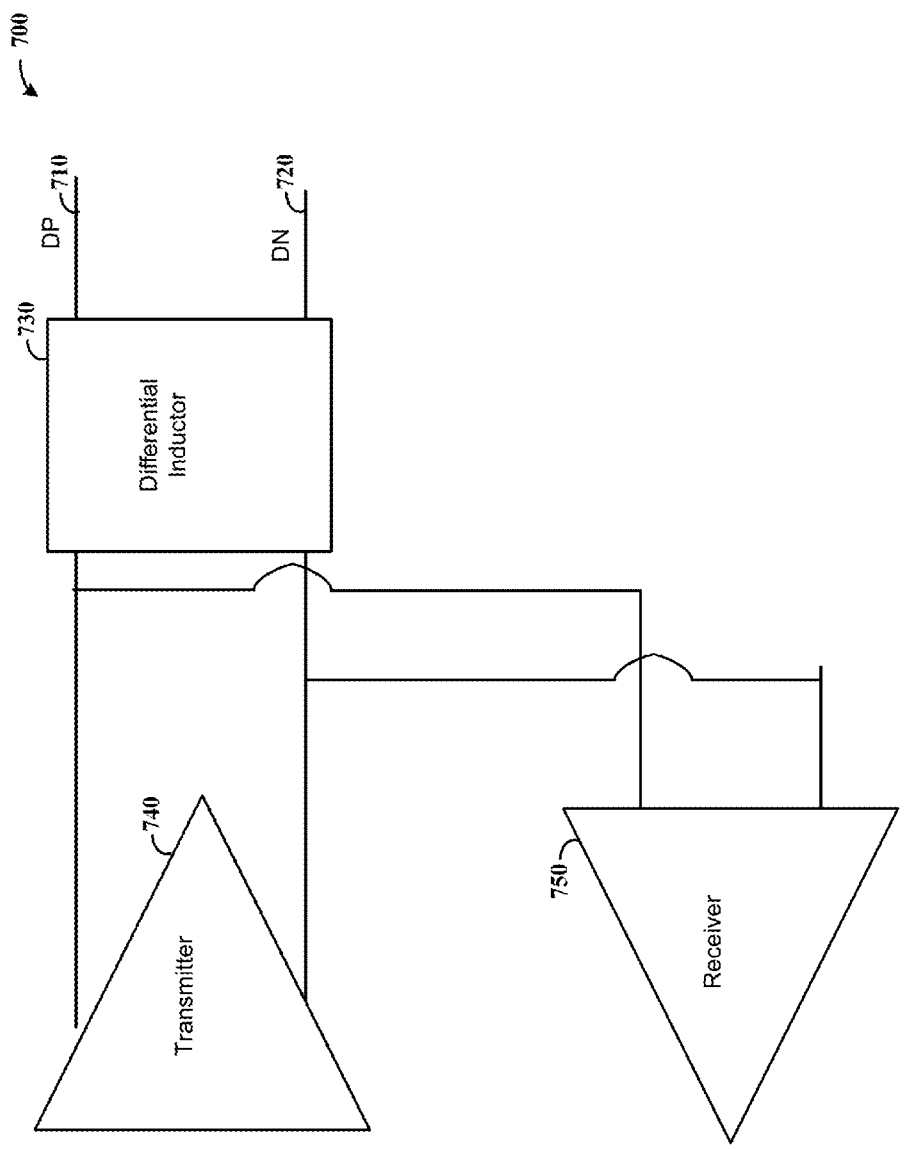
FIG. 7 shows another circuit with impedance matching and a differential inductor, in accordance with another example embodiment.

FIG. 7 shows a circuit 700 with impedance matching circuitry and a differential inductor 730, in accordance with another example embodiment. Receiver port 710 and transmitter port 720 are respectively coupled to the differential inductor 730, which operates to impedance match for transmitter circuit 740 and receiver circuit 750.

Figure 8:
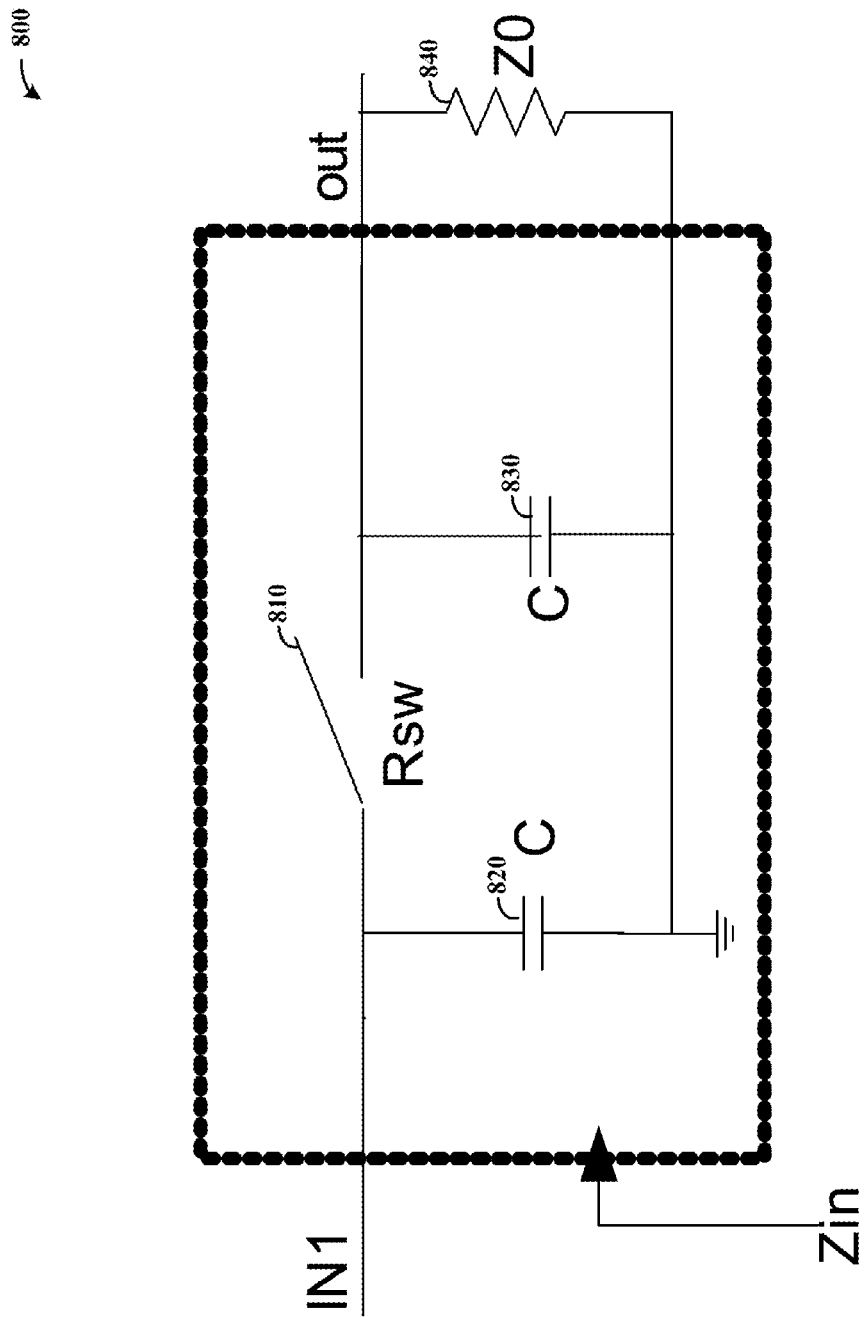
FIG. 8 shows a circuit diagram useful in determining impedance for impedance matching, in accordance with another example embodiment.

FIG. 8 shows a circuit diagram 800, useful in determining an impedance match, in accordance with another example embodiment. Where the switch 810 Rsw=0, as coupled to capacitors 820 and 830 with resistor 840 as shown, an equation for input impedance (Zin) is:

$$Zin = \left(\frac{Z0}{Z02j\omega C + 1}\right) \to 1$$

The magnitude of Zin is given by:

$$Zin = \left(\frac{Z_0}{\sqrt{(Z02\omega C)^2 + 1}}\right) \to 2$$

For return loss $$(RL) \text{ of} = \frac{Zo - Zin}{Zo + Zin},$$

the return loss is −8 dB, which means 38% of the signal is reflected back due to impedance mismatch. Accordingly, an impedance can be set to match and counter such return loss.

Figure 9:
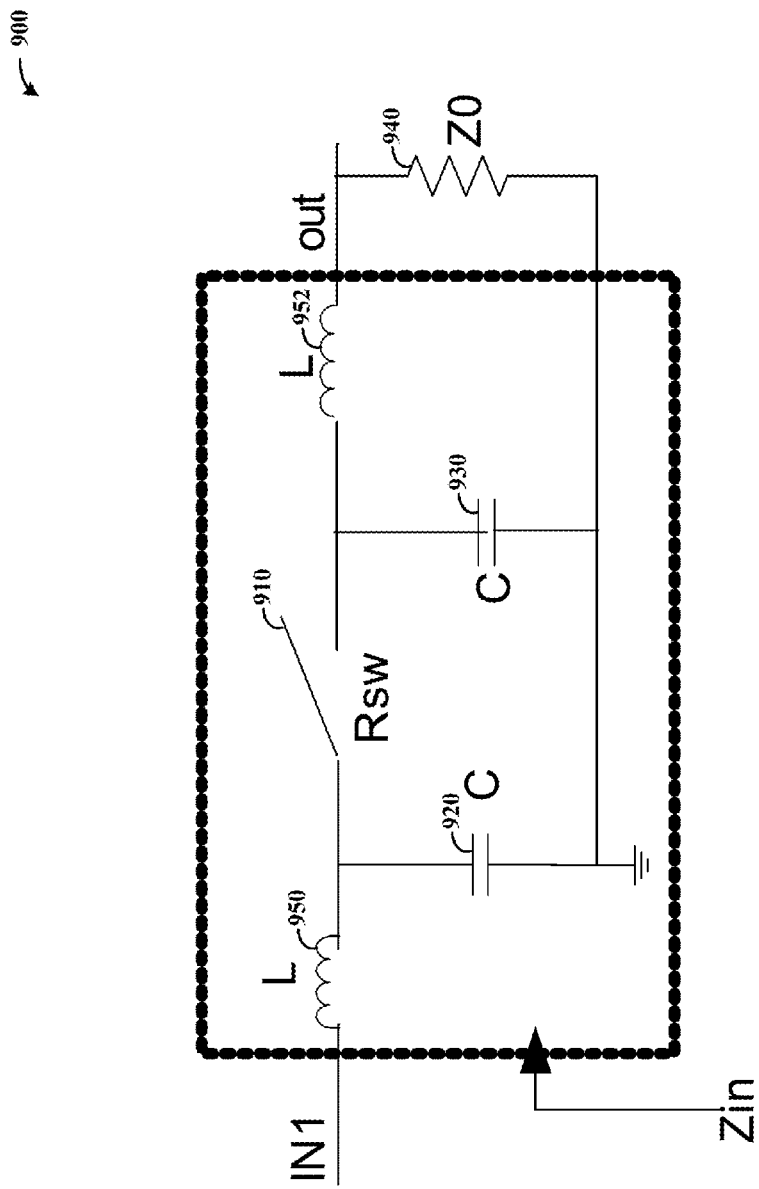
FIG. 9 shows a circuit diagram useful in determining impedance matching for return loss in a high speed switch, in accordance with another example embodiment.

FIG. 9 shows a circuit diagram 900, useful in determining an impedance match for return loss in a high speed switch, in accordance with another example embodiment. The circuit includes switch 910, capacitors 920 and 930, a resistor 940 and inductors 950 ad 952. Where Rsw=0, input impedance (Zin) is:

$$Zin = \left(\frac{Z0 + j\omega L}{Z0 + j\omega L + \frac{1}{j\omega C}}\right) + j\omega L \to 1$$

Figure 10:
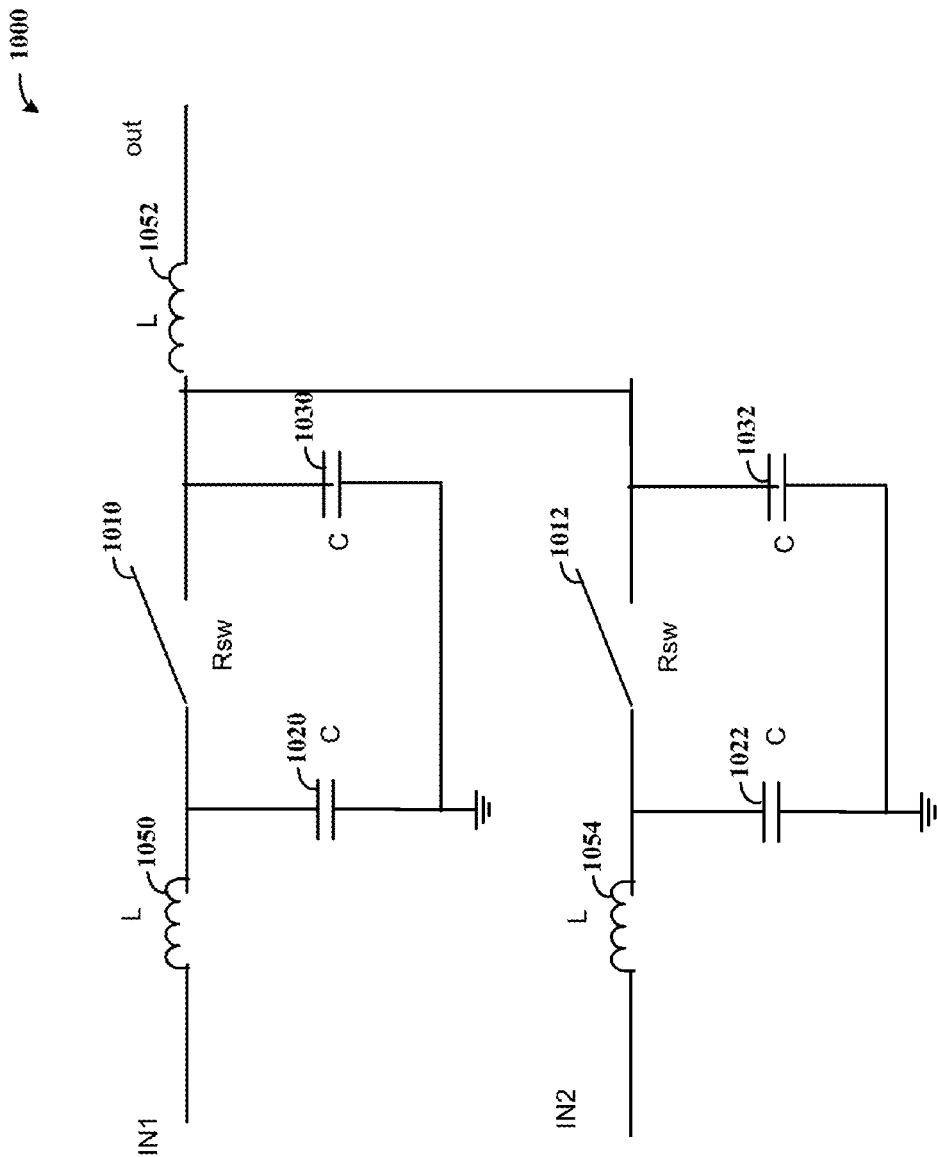
FIG. 10 shows a high speed multiplexer with signal loss mitigation, in accordance with another example embodiment.

FIG. 10 shows a high speed multiplexer 1000 with signal loss mitigation, in accordance with another example embodiment. Switch 1010 couples capacitors 1020 and 1030, with inductors 1050 and 1052, operating to mitigate signal loss at IN1. Switch 1012 couples capacitors 1022 and 1032, with inductors 1054 and 1052, operating to mitigate signal loss at IN2.

Figure 11:
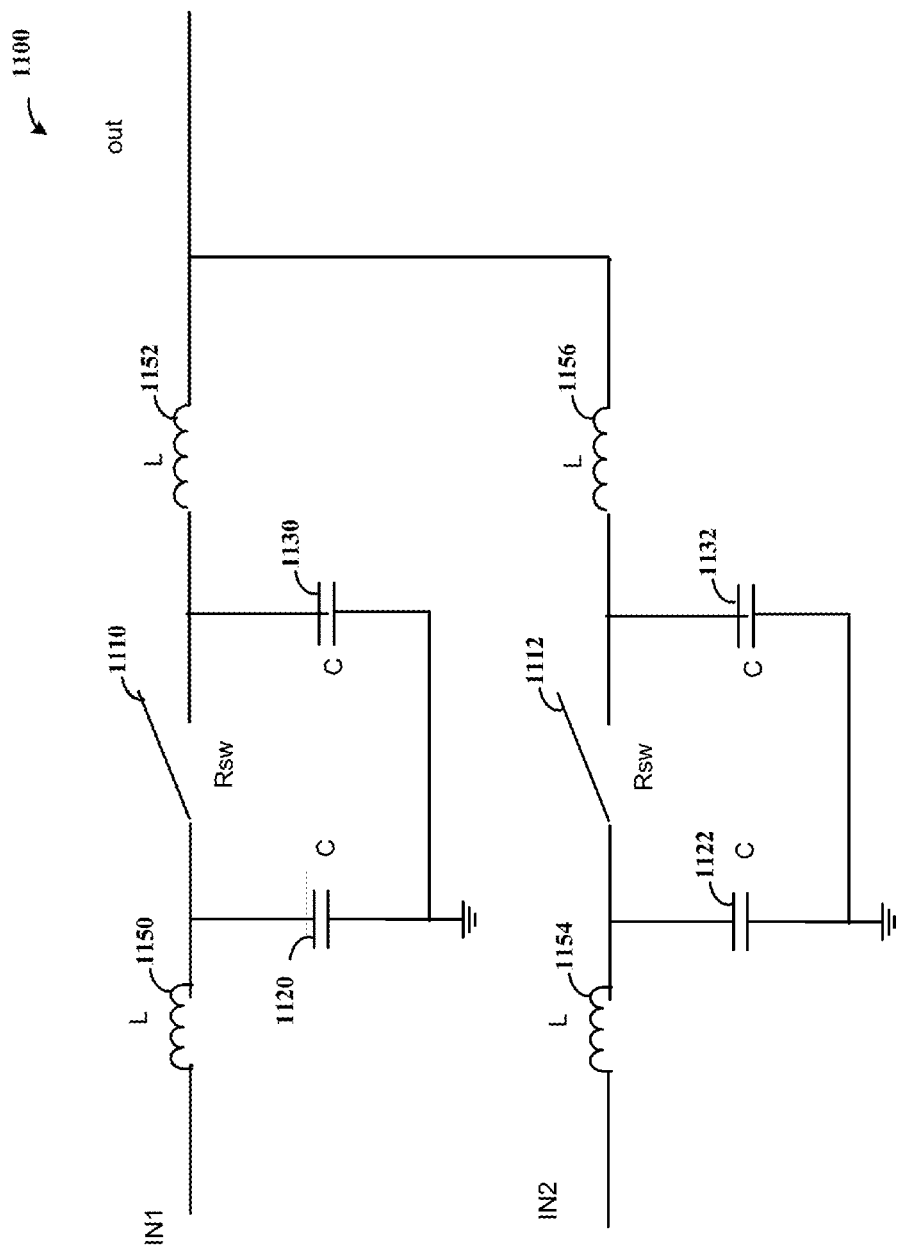
FIG. 11 shows another high speed multiplexer with signal loss mitigation, in accordance with another example embodiment.

FIG. 11 shows another high speed multiplexer 1100 with signal loss mitigation, in accordance with another example embodiment. Switch 1110 couples capacitors 1120 and 1130, with inductors 1150 and 1152, operating to mitigage signal loss at IN1. Switch 1112 couples capacitors 1122 and 1132, with inductors 1154 and 1156 operating to mitigate signal loss at IN2.

Figure 12:
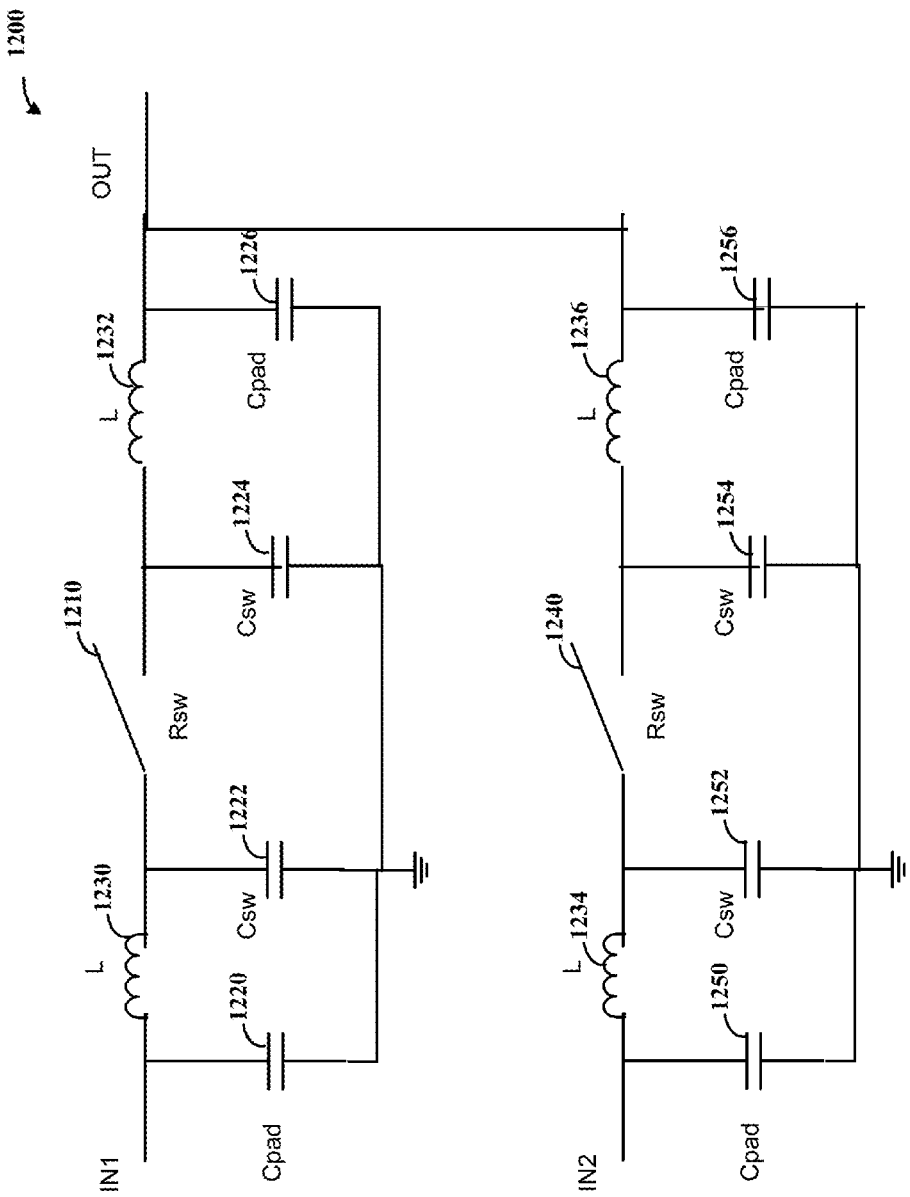
FIG. 12 shows a circuit having impedance matching where switch capacitance is greater than pad capacitance, in accordance with another example embodiment.

FIG. 12 shows a circuit 1200 having impedance matching in which switch capacitance (Csw) is greater than pad capacitance (Cpad), in accordance with another example embodiment.

If Csw>>>Cpad then adding inductance improves insertion and return loss. Accordingly, capacitors 1220, 1222, 1224 and 1226 are coupled as shown to IN1, with inductors 1230 and 1232 coupled by switch 1210. Capacitors 1250, 1252, 1254 and 1256 are coupled as shown to IN2, with inductors 1234 and 1236 coupled by switch 1240.

Figure 13:
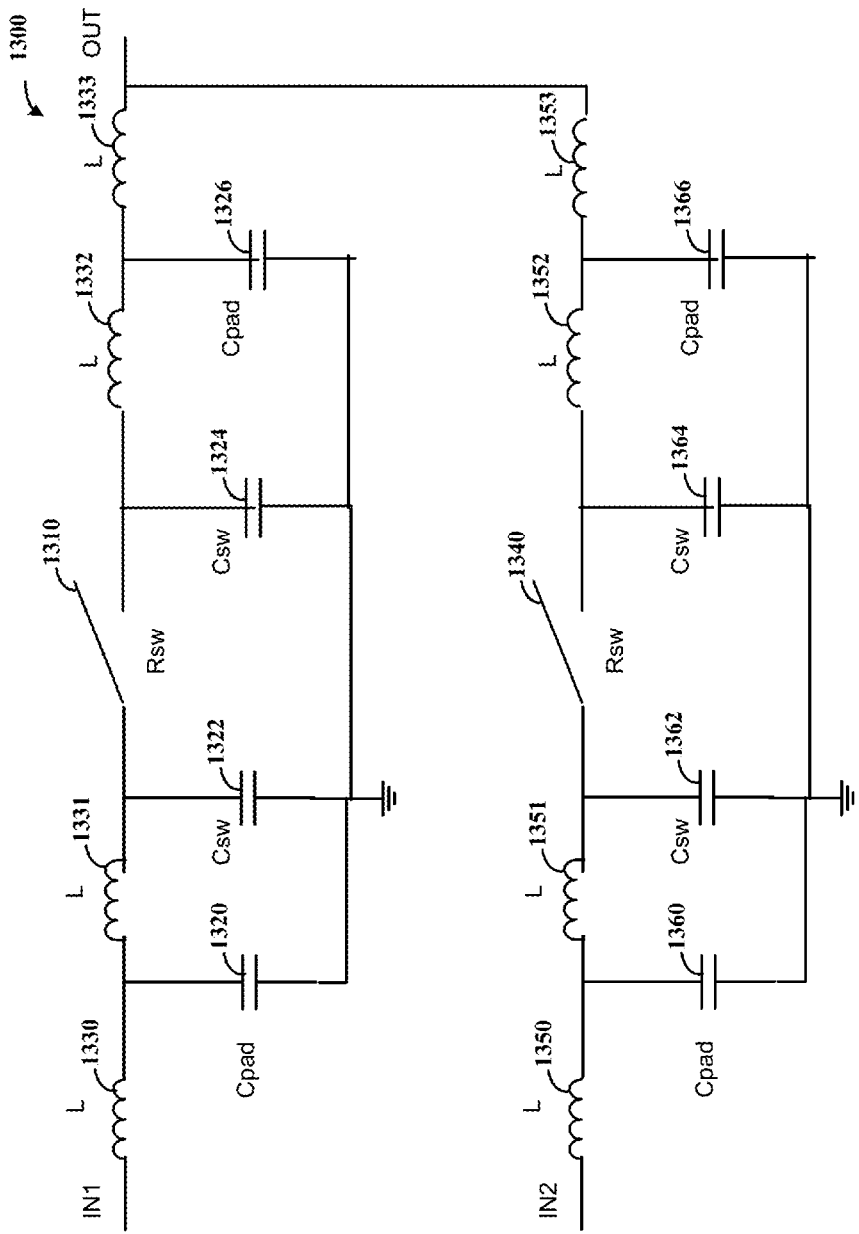
FIG. 13 shows another a circuit having impedance matching where switch capacitance is greater than pad capacitance, in accordance with another example embodiment.

FIG. 13 shows another a circuit 1300 having impedance matching in which switch capacitance is greater than pad capacitance, in accordance with another example embodiment. Capacitors 1320, 1322, 1324 and 1326 are coupled as shown to IN1, with inductors 1330, 1331, 1332 and 1233 coupled by switch 1310. Capacitors 1360, 1362, 1364 and 1366 are coupled as shown to IN2, with inductors 1350, 1351, 1352 and 1353 coupled by switch 1340. The inductors can be implemented as on-chip silicon inductors, with the capacitors implemented such that the pad capacitance (Cpad) is less significant than the switch capacitance (Csw), which can be achieved by using small pad sizes, with distributed pad capacitance and distributed inductances as shown in FIG. 13.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., impedance-matching circuitry, or processing circuitry). For example, in certain of the above-discussed embodiments, one or more modules are discrete logic circuits or programmable logic circuits configured and arranged for implementing these operations/activities, as in the circuit modules shown in FIG. 1. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the various embodiments without strictly following the exemplary embodiments and applications illustrated and described herein. For example, different types of impedance matching circuits, such as those that may or may not include inductors, may be implemented in various embodiments. Similarly, impedance matching may be provided at different locations within a circuit, such as via direct connection to an external interface port, or to an internal connector such as a bond pad. Such modifications do not depart from the true spirit and scope of various aspects of the invention, including aspects set forth in the claims.

The invention claimed is:

1. An apparatus comprising:
an integrated circuit (IC) chip including:
a signal-connection terminal;
processing circuitry configured and arranged to pass signals along a communication path within the IC chip and connected to the signal-connection terminal; the processing circuitry including a switch circuit that is configured to selectively connect the signal-connection terminal to a channel from a plurality of channels connectable by the switch, the switch circuit introducing loading on the communication path that creates impedance-mismatching for a particular channel of the plurality of channels; and
impedance-matching circuitry configured and arranged to provide impedance-matching for the communication path and the particular channel, therein mitigating signal loss due to the impedance-mismatching; and
a chip-mounting structure configured and arranged to secure the IC chip and to electrically connect thereto at the signal-connection terminal; and
wherein the signal-connection terminal includes a plurality of connector pads on a lower surface of the IC chip, and the impedance-matching circuitry includes respective inductive circuits connected to each of the connector pads, each inductive circuit being configured and arranged to provide an impedance at the connector pad to which it is connected that matches an impedance of a communication path between the connector pad and an external load coupled thereto.

2. The apparatus of claim 1, wherein the impedance-matching circuitry includes a variable-length inductor circuit and is configured and arranged to:
detect an external impedance provided by an external load and interconnections between the external load and the signal-connection terminal, and
provide the impedance-matching for the communication path by dynamically modifying the length of the variable-length inductor circuit and matching the detected impedance via the modified length.

3. The apparatus of claim 2, wherein the impedance-matching circuitry includes at least one switch connected to the variable-length inductor and configured and arranged to modify inductance provided by the inductive circuit by connecting and disconnecting portions of the variable-length inductor.

4. The apparatus of claim 1, wherein the impedance-matching circuitry includes an inductor on the particular channel, and the impedance-matching circuitry is configured and arranged to provide the impedance-matching for the communication path by using the switch circuit to connect the particular channel to the signal-connection terminal and thereby connecting the inductor to the signal-connection terminal.

5. The apparatus of claim 1, wherein
the IC chip is configured and arranged to provide a capacitance, and
the impedance-matching circuitry includes an inductor that is configured and arranged with the IC chip to provide an LC circuit, having an impedance that matches an impedance presented to the IC chip via the signal-connection terminal, by using the capacitance provided by the IC chip and an inductance provided by the inductor, wherein the impedance-matching circuitry is configured and arranged to provide the LC circuit having the impedance by creating resonance with the capacitance.

6. The apparatus of claim 1, wherein the impedance-matching circuitry includes a variable inductor circuit and is configured and arranged to:
detect an external impedance provided by an external load and interconnections between the external load and the signal-connection terminal, and
provide the impedance-matching for the communication path by dynamically modifying the inductance of the inductor circuit.

7. The apparatus of claim 1, wherein the impedance-matching circuitry and the processing circuitry are embedded within a silicon layer of the IC chip, and wherein the IC chip is connected to the chip-mounting structure via bond pads including the signal-connection terminal and without using bond wires.

8. The apparatus of claim 1, wherein
the IC chip has a lower planar surface and the signal-connection terminal is on the lower planar surface; and
the chip-mounting structure has an upper planar surface in contact with the lower planar surface of the IC chip, and another signal connection terminal on the upper planar surface in contact with the signal-connection terminal.

9. The apparatus of claim 1, wherein the impedance-matching circuitry is configured and arranged to match an impedance provided by an external load connected to the signal-connection terminal via the chip-mounting structure, and to mitigate signal loss along a communication path along which the signals are passed between the processing circuitry and the external load.

10. The apparatus of claim 1, wherein
the communication path includes interconnect circuitry that connects the processing circuitry to the signal-connection terminal, and
the impedance-matching circuitry and the interconnect circuitry are in a common silicon layer of the IC chip, and the impedance-matching circuitry is spaced apart from the interconnect circuitry by a portion of the silicon that mitigates inductive coupling between the impedance-matching circuitry and the interconnect circuitry.

11. The apparatus of claim 1, wherein the impedance-matching circuitry is configured and arranged to provide an impedance to the signal-connection terminal based on a signal speed of the signals passed along the communication path.

12. The apparatus of claim 1, wherein the IC chip has a lower planar surface with the signal-connection terminal being proximal to the lower planar surface and being connected to a chip-mounting node via the terminal, and wherein the impedance-matching circuitry is connected with the signal-connection terminal.

13. The apparatus of claim 1:
wherein the impedance-matching circuitry includes an inductor in an inductive circuit located between the switch circuit and the signal-connection terminal.

14. A method comprising:
passing signals along a communication path within an integrated circuit (IC) chip, the IC chip including a signal-connection terminal and processing circuitry, the signal-connection terminal being electrically connected to a chip-mounting structure that secures the IC chip, the signals being passed via the signal-connection terminal;
selectively connecting the communication path to ports from a plurality of ports using a switch circuit that introduces a load that creates impedance-mismatching for the communication path when at least one of the plurality of ports is connected by the switch circuit; and
mitigating signal loss due to the impedance-mismatching, by providing impedance-matching for the communication path using an inductive circuit located between the switch circuit and the signal-connection terminal, the impedance matching being provided in response to the at least one of the plurality of ports being connected to the communication path by the switch circuit; and
wherein the signal-connection terminal includes a plurality of connector pads on a lower surface of the IC chip, and further including impedance-matching circuitry that includes respective inductive circuits connected to each of the connector pads, each inductive circuit being configured and arranged to provide an impedance at the connector pad to which it is connected that matches an impedance of a communication path between the connector pad and an external load coupled thereto.

15. The method of claim 14, wherein mitigating signal loss due to impedance-mismatching includes using an inductor and a capacitance provided by the IC chip to match an impedance presented at an interface between the IC chip and an external communication link.

16. The method of claim 15, wherein using the inductor and the capacitance provided by the IC chip to match the impedance presented at the interface includes causing resonance with the capacitance, by coupling the inductor to the signal-connection terminal.

17. The method of claim 14, wherein mitigating signal loss due to impedance-mismatching includes
detecting an external impedance presented at an interface between the IC chip and an external communication link,
setting an inductance of a variable inductor circuit based upon the detected external impedance and a capacitance of the IC chip, and
using the variable inductor circuit, at the set inductance, to match the detected external impedance.

18. The method of claim 14, wherein the signal-connection terminal connects the chip to an interface cable that is external to the IC chip, wherein the impedance-matching circuitry mitigates signal loss along the communication path due to impedance-mismatching, by matching an impedance presented to the signal-connection terminal.

19. An apparatus comprising:
a chip-mounting structure having a planar surface and a first signal connection terminal;
an integrated circuit (IC) chip having a second signal connection terminal on a planar surface, the respective signal connection terminals being connected to one another with the planar surfaces of the chip mounting structure and the integrated circuit chip facing one another, the IC chip including:
   an interface circuit configured and arranged to interface with a remote device via a communication link connected to the interface circuit,
   processing circuitry configured and arranged to pass signals received via the interface circuit along a communication path including interconnect circuitry within the IC chip and connected to the signal connection terminals, the processing circuitry including a switch circuit that is configured to selectively connect the signal-connection terminals to a channel from a plurality of channels connectable to the signal connection terminals by the switch, the switch circuit introducing loading on the communication path that creates impedance-mismatching for at least one of the channels of the plurality of channels; and
impedance-matching circuitry including an inductive circuit located between the switch circuit and the signal-connection terminals, the impedance-matching circuit configured and arranged to provide impedance-matching for the communication path and the at least one of the channels of the plurality of channels, therein mitigating signal loss due to the impedance-mismatching;
wherein the signal-connection terminals include a plurality of connector pads on a lower surface of the IC chip, and the impedance-matching circuitry includes respective inductive circuits connected to each of the connector pads, each inductive circuit being configured and arranged to provide an impedance at the connector pad to which it is connected that matches an impedance of a communication path between the connector pad and an external load coupled thereto.

20. The apparatus of claim 19, wherein
the IC chip is configured and arranged to provide a capacitance, and
the impedance-matching circuitry includes an inductor that is configured and arranged with the IC chip to provide an LC circuit having an impedance that matches an impedance presented to the IC chip by the communication link, by using the capacitance provided by the IC chip and an inductance provided by the inductor.

21. The apparatus of claim 19, wherein the impedance-matching circuitry and the interconnect circuitry are in a common silicon layer of the IC chip, and the impedance-matching circuitry is spaced apart from the interconnect circuitry by a portion of the silicon that mitigates inductive coupling between the impedance-matching circuitry and the interconnect circuitry.

* * * * *